Sept. 23, 1958 E. W. HEROLD 2,853,603

DUAL CHANNEL TRANSISTOR AMPLIFIER

Filed March 20, 1957

INVENTOR.
EDWARD W. HEROLD
BY H. O. Newton
ATTORNEY 2,853,603

DUAL CHANNEL TRANSISTOR AMPLIFIER

Edward W. Herold, Princeton, N. J., assignor to Radio Corporation of America, a corporation of Delaware Application March 20, 1957, Serial No. 647,299

13 Claims. (Cl. 250—20)

Figure 1:
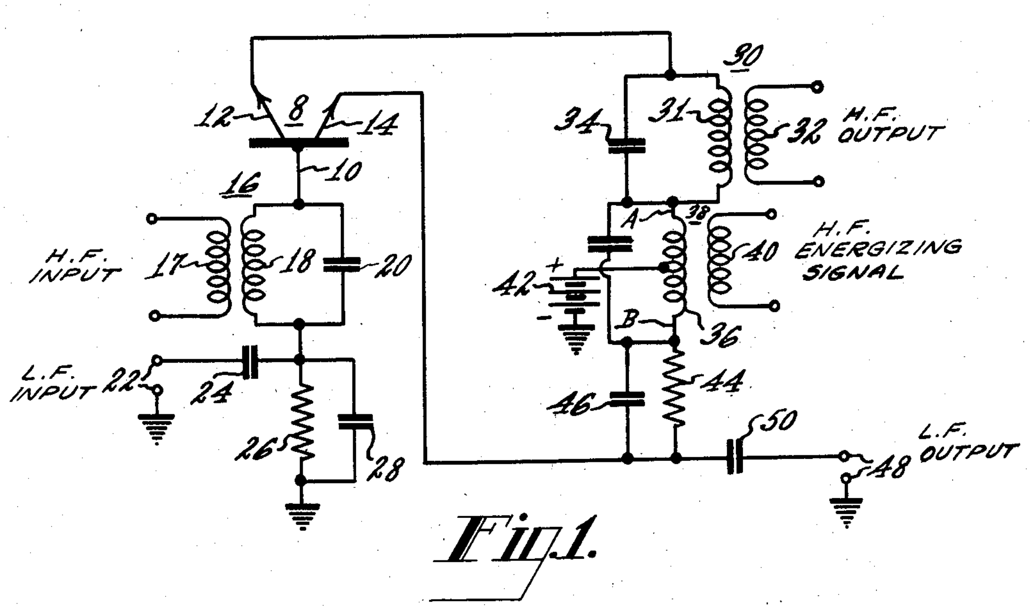

This invention relates to signal amplifier circuits, and particularly to transistor signal amplifier circuits for effective dual-channel amplification of signals of different frequencies, as in signal receiving systems and the like.

It is often desired for economic or other reasons to amplify two signals of different frequencies with a single amplifying device, such as a transistor or a tube. This type operation may be achieved, for example, by a reflex amplifier circuit through which the signal passes both before and after a change of frequency. A reflex amplifier circuit may be used, for example, in a radio receiver to amplify both the intermediate frequency and audio frequency signals. One disadvantage of this type circuit is that there is a tendency for the two signals to interact or cross-modulate. Another possible arrangement for amplifying signals of two different frequencies with a single device is to use a switch operating at a high frequency to alternately connect the amplifying device to the two frequency channels. This type circuit requires relatively complicated switching circuits and may be unreliable.

It is, accordingly, an object of this invention to provide an improved signal amplifier circuit capable of amplifying two signals of different frequencies without substantial interaction therebetween.

It is another object of this invention to provide an improved transistor circuit utilizing a single transistor for the amplification of both the intermediate frequency and audio frequency signals of a signal receiving system.

It is yet another object of this invention to provide improved signal amplifying means for radio receivers and the like wherein the symmetrical properties of a transistor effectively permit the amplification of two different frequency signals without the need of switching circuits.

To amplify signals of two different frequencies through a single amplifying device, in accordance with the invention, a symmetrical or substantially symmetrical transistor is biased by a relatively high frequency alternating current supply source. The transistor has a base electrode to which the different frequency signals are applied and two further substantially similar electrodes. Separate output circuits for the two different frequency signals are connected between the two further electrodes. The circuit operation is such that the transistor amplifies one of the signals on one-half cycle of the high frequency alternating current supply source and the other signal on alternate half-cycles of the supply source. In a radio receiver, the signals to be amplified may be the intermediate frequency and audio frequency signals and the alternating current supply signal may be the local oscillator signal.

Figure 2:
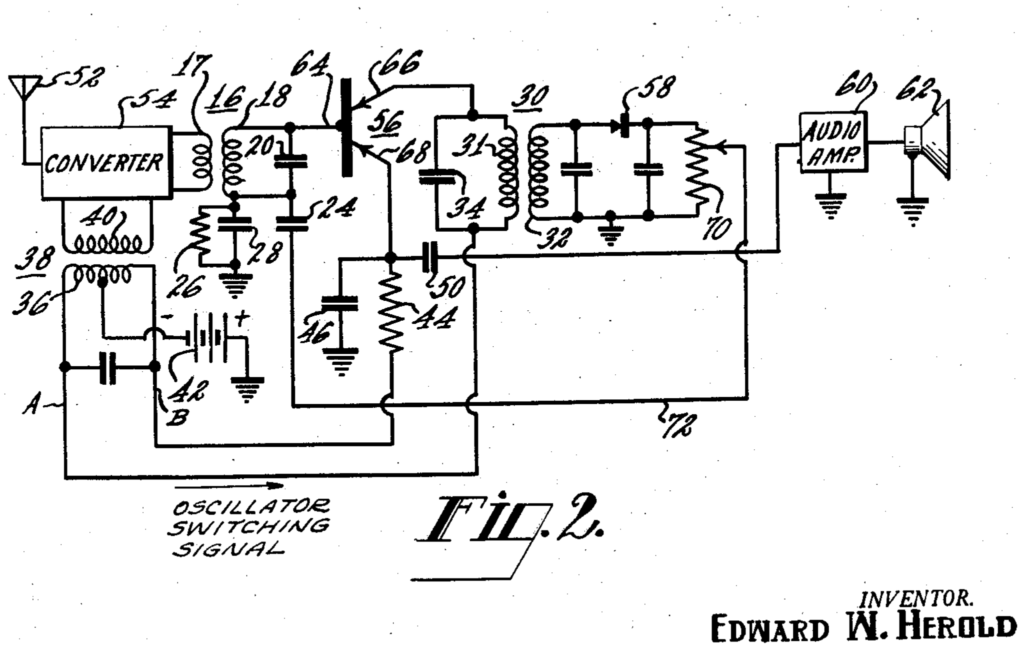

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of a transistor signal amplifier circuit embodying the invention; and Figure 2 is a schematic circuit diagram, partially in block diagram form, of a signal receiving system including a signal amplifier circuit embodying the invention.

Referring now to the drawing wherein like parts are indicated by like reference numerals in both figures, and referring particularly to Figure 1, a dual-channel amplifier embodying the invention includes a transistor 8 which may be considered to be of the N–P–N junction type. The transistor 8 is chosen to be symmetrical or nearly symmetrical and includes a base electrode 10 and two further electrodes 12 and 14 which are substantially physically identical. Normally the electrodes 12 and 14 would be referred to as collector and emitter electrodes. This designation is not appropriate for a symmetrical transistor however since, depending on the bias, the electrodes 12 and 14 will interchangeably serve as emitter and collector electrodes. Since the base of the transistor 8 is of P-type conductivity, the application of positive bias to the electrode 12 relative to the voltage on the base 10 will make this electrode the collector, the electrode 14 acting as an emitter. If, on the other hand, a negative bias voltage is applied to the electrode 12 relative to the base voltage the electrode 12 will act as an emitter, the electrode 14 acting as a collector in this case.

The two signals of different frequencies which are to be amplified are applied to the base electrode 10 of the transistor 8. One of these signals, which may be of a higher frequency than the second signal, is applied through a transformer 16 having a primary winding 17 and a secondary winding 18, the secondary winding 18 being connected directly with the base 10. The secondary winding 18 may be shunted by a tuning capacitor 20 to tune the secondary circuit of the transformer to the frequency of the applied signal. The second signal, which in the present example will be assumed to be of a frequency lower than the frequency of the first signal, is applied to the amplifier circuit through a pair of input terminals 22, one of which is grounded and the other of which is connected through a capacitor 24 to the junction of the secondary winding 18 and a bias resistor 26, the other end of which is grounded. The resistor 26 is by-passed for radio-frequency signals by a by-pass capacitor 28.

The circuit defined by the other two electrodes 12 and 14 of the transistor includes separate output circuits for the signals of the two frequencies which are applied to the base circuit and, in addition, a direct-current supply source and a relatively high frequency alternating current supply source. One of the output circuits comprises an output transformer 30 which includes a primary winding 31, which is connected to the electrode 12, and a secondary winding 32. The primary winding is shunted by a tuning capacitor 34, which tunes the primary circuit of the transformer 30 to the frequency of the highest frequency signal to be amplified, i. e., in the example shown, the signal applied to the base through the transistor 16. The low signal voltage end of the primary tuned circuit is connected through the secondary winding 36 of a transformer 38 and a resistor 44 to the other electrode 14 of the transistor 8. The transformer 38 is provided with a primary or input winding 40 to which the relatively high-frequency energizing signals are applied. A direct-current bias source, such as a battery 42, is grounded at its negative terminal and its positive terminal is connected to an intermediate or center tap on the secondary winding 36. If the transistor 8 were chosen to be of N type conductivity, the polarity of the supply source 42 would be reversed. The resistor 44 is by-passed for radio signal frequencies by a by-pass capacitor 46. An output circuit for the second and lower frequency output signal includes a pair of output terminals 48, one of which is grounded and the other of which is connected through a coupling capacitor 50 to the electrode 14 of the transistor 8.

The alternating current supply voltage, which is applied to the transformer 38, is normally selected to have a frequency higher than the frequency of the highest frequency signal to be amplified. As an example, the frequency of the supply voltage would normally be chosen to be at least one and one-half times higher than the frequency of the signal which is applied to the base 10 through the transformer 16. When the supply signal is of such a polarity to make the point A in Figure 1 positive, the electrode 12 of the transistor 8 serves as a collector while the electrode 14 is then the emitter. Accordingly, the higher frequency signal which is derived from the output transformer 30 is in the collector circuit while the lower frequency signal which is derived across the output terminals 48 is in the emitter circuit. The higher frequency signal is thus amplified by the transistor 8 operating as a common emitter amplifier. The voltage and power gain are thus high. The lower frequency signal, however, is translated through the transistor 8, operating as a common collector amplifier, with relatively low power and voltage gains. Thus, on one cycle of the applied high frequency signal supply source, the higher frequency signal is highly amplified while the lower frequency signal receives little or no amplification.

On alternate half-cycles of the high frequency supply signal, the point B in the circuit of Figure 1 is positive. Thus the electrode 14 serves as a collector while the electrode 12 is then the emitter. Accordingly, the lower frequency signal, which is derived from the output terminals 48, is in the collector circuit while the higher frequency signal is in the emitter circuit. Thus, the lower frequency signal is amplified by the transistor 8 operating as a common emitter amplifier with relatively large voltage and power gain. The higher frequency signal, however, is translated through the transistor 8 operating as a common collector amplifier with low power and voltage gain. Thus, on the alternate half cycle of the applied high frequency signal supply source, the lower frequency signal is highly amplified. The battery 42 serves to supply the proper bias to the base of the transistor and is adjusted to a value best suited for the purpose, e. g., to a value approximately one-half the alternating voltage between point A and B. By using a symmetrical or nearly symmetrical junction transistor, or a transistor in which the junction electrodes amplify in either direction, a dual-channel amplifier is possible without switches or relatively complicated reflex circuit connections.

In Figure 2, a superheterodyne radio receiver embodying the invention, includes an antenna 52, a converter 54, a symmetrical transistor 56 for amplifying the audio frequency and intermediate frequency signals on a time shared basis, a second detector diode 58, an audio amplifier 60, and a loudspeaker 62. The converter 54 is operative to heterodyne or mix the signal received by the antenna 52 with a generated local oscillator signal to provide an intermediate frequency signal, as is conventional. The intermediate frequency signal is applied through the transformer 16 to the base electrode 64 of the symmetrical transistor 56. In Figure 2, the transistor 56 may be considered to be, and has been illustrated as a P–N–P junction transistor, and includes in addition to the base electrode 64 two further substantially similar electrodes 66 and 68. As in Figure 1, these electrodes are not designated as either an emitter or collector, since the transistor 56 is chosen to be symmetrical or nearly symmetrical. Thus the electrodes 66 and 68 are operative as either an emitter or collector depending on the polarity of the bias voltage which is applied to them. If one serves as an emitter, then the other serves as a collector. Since, however, the base of transistor 56 is of N type conductivity, one of the electrodes 66 and 68 operates as a collector when the applied bias voltage is more negative than the base voltage, while the electrode which is more positive than the base operates as an emitter.

The high-frequency alternating current supply for the symmetrical transistor 56 is derived from the converter transistor 54 and may comprise the generated local-oscillator signal of the receiver. The local oscillator signal, or a portion thereof, is applied through the transformer 38 to the electrodes 66 and 68 in the same manner as in Figure 1. Since the transistor 56 is of N type conductivity, the positive terminal of the bias battery 42 is grounded while the negative terminal is connected to the tap on the secondary winding 36 of the transformer 38. By using the local oscillator signal as the alternating current supply source, a separate supply source is not needed.

The amplified higher or intermediate-frequency signal is applied through the transformer 30 to the diode detector 58. The diode detector 58 is operative to separate the audio frequency signal from the intermediate frequency signal. The audio signal, which is derived across a variable volume control resistor 70, is applied through the lead 72 and the coupling capacitor 24 to the base 64 of the symmetrical transistor 56. The audio frequency signal is then amplified on alternate half-cycles of the local oscillator supply signal to provide an amplified audio frequency signal. This signal, which is derived from the electrode 68, is applied through the coupling capacitor 50 to the audio amplifier 60. The audio frequency signal is then further amplified by the amplifier 60 and applied to the loudspeaker 62 for reproduction.

In operation, the received signal is heterodyned with the generated local oscillator signal in the converter 54 to provide an intermediate frequency signal. A portion of the generated local oscillator signal is applied through the transformer 38 to the electrodes 66 and 68 of the symmetrical transistor 56. If the polarity of the local oscillator signal is such that point A is negative relative to the base voltage of the transistor 56, the electrode 66 of the transistor 56 serves as a collector. The transistor 56 will, therefore, amplify the intermediate frequency signal as a common emitter amplifier. The intermediate frequency signal is detected by the diode rectifier 58 and applied to the base 64 of the symmetrical transistor 56. On alternate half-cycles of the oscillator signal, the point B is negative relative to the base voltage. On this half-cycle of the oscillator, the electrode 68 of the transistor 56 serves as a collector. The audio frequency signal is thus amplified by the transistor 56 as a common emitter amplifier. The amplified audio frequency signal is then applied from the electrode 68 to the audio amplifier 60 and thence to the loudspeaker 62 for reproduction as above noted.

Amplification of signals of two different frequencies is achieved, in accordance with the invention, with relatively simple circuitry. These circuits do not require complicated switches and the signals of the two different frequencies which are amplified interact little, if at all. Thus the invention is suitable for use in receiving systems where compact and relatively economical circuits are desired or required.

What is claimed is:

1. A signal amplifier circuit comprising, in combination, a transistor having an input electrode and two further electrodes, first signal input means connected for applying a first input signal of one frequency to said input electrode, second signal input means connected for applying a second input signal of a second frequency to said input electrode, alternating-current supply means connected to energize said further electrodes to provide signal translation and amplification of said first input signal between said input and one of said further electrodes and of said second input signal between said input and the other of said further electrodes, first signal output circuit means connected for deriving an amplified output signal of said one frequency from said one of said further electrodes, and second signal output circuit means connected for deriving an amplified output signal of said second frequency from the other of said further electrodes.

2. In a signal receiver, the combination comprising a single-stage audio-frequency and intermediate-frequency signal amplifier including a substantially symmetrical transistor having a base electrode and first and second substantially similar further electrodes, first signal input means connected for applying an intermediate-frequency signal to said base electrode, first signal output means connected for deriving an amplified intermediate-frequency signal from said first further electrode, signal detection means connected with said first signal output means for deriving an audio-frequency signal from said intermediate-frequency signal, signal coupling means connecting said signal detection means with said base electrode for applying said audio frequency signal thereto, means for generating a local oscillator signal, means for applying said local oscillator signal to said further electrodes as a relatively high frequency supply source to alternately provide signal translation and amplification of said intermediate-frequency signal between said base electrode and said first further electrode and of said audio-frequency signal between said base electrode and said second further electrode, and second signal output circuit means connected with said second further electrode for deriving therefrom an amplified audio frequency signal.

3. A dual-channel signal translating circuit comprising, in combination, a symmetrical transistor of the junction type having a base electrode and two substantially identical further electrodes, first signal input means connected for applying a first input signal of a first frequency to said base electrode, second signal input means connected for applying a second input signal of a second and different frequency to said base electrode, alternating current supply means connected for applying a relatively high frequency voltage of a higher frequency than said first and second frequencies to said further electrodes to provide bias voltages for said further electrodes which alternate in polarity and signal translation of said first input signal between said base and one of said further electrodes through said transistor effectively operating as a common emitter amplifier and of said second input signal between said base and the other of said further electrodes through said transistor effectively operating as a common emitter amplifier, first signal output circuit means connected for deriving an output signal of said first frequency from said one of said further electrodes, and second signal output circuit means connected for deriving an output signal of said second frequency from the other of said further electrodes.

4. In a signal receiving system, the combination comprising, means for amplifying audio-frequency and intermediate-frequency signals in time-shared relation including a transistor having a base electrode and two substantially similar further electrodes, first signal input means connected for applying said audio frequency signal to said base electrode, second signal input means connected for applying said intermediate frequency signal to said base electrode, alternating-current supply means connected for applying a relatively high-frequency voltage to said further electrodes to alternately provide signal translation and amplification of said intermediate frequency signal between said base and one of said further electrodes and of said audio frequency signal between said base and the other of said further electrodes, first output circuit means connected for deriving an amplified intermediate frequency signal from said one of said further electrodes, and second output circuit means connected for deriving an amplified audio-frequency signal from the other of said further electrodes.

5. In a signal receiving system, the combination as defined in claim 4, wherein said alternating-current supply means is a converter stage and wherein said high-frequency voltage is a local-oscillator signal of a higher frequency than said audio and intermediate-frequencies.

6. A dual-channel signal amplifier circuit comprising, in combination, a transistor having a base electrode and two substantially similar further electrodes, first signal input means connected for applying a first input signal of one frequency to said base electrode, second signal input means connected for applying a second input signal of a second frequency to said base electrode, alternating-current supply means connected for applying a relatively high frequency voltage to said further electrodes to alternately provide signal translation and amplification of said first input signal between said base and one of said further electrodes and of said second input signal between said base and the other of said further electrodes, first signal output circuit means connected for deriving an amplified output signal of said one frequency from said one of said further electrodes, and second signal output circuit means connected for deriving an amplified output signal of said second frequency from the other of said further electrodes.

7. In a signal receiver, the combination comprising, a transistor having a base electrode and a first and a second substantially similar further electrode, first signal input means connected for applying an intermediate-frequency signal to said base electrode, first signal output means connected for deriving an intermediate-frequency signal from said first further electrode, means for deriving an audio frequency signal in response to said intermediate-frequency signal and for applying said audio-frequency signal to said base electrode, means in said receiver for generating a relatively high-frequency alternating-current supply voltage, means for applying said supply voltage to said further electrodes to provide bias voltages therefor and to alternately provide signal translation of said intermediate-frequency signal between said base electrode and said first further electrode and of said audio-frequency signal between said base electrode and said second further electrode, and second signal output circuit means connected with said second further electrode for deriving therefrom an audio-frequency signal.

8. In a radio signal receiver, the combination comprising, a single stage audio-frequency and intermediate-frequency signal amplifier including a symmetrical transistor having a base electrode and first and second substantially similar further electrodes adapted to be alternately operative as emitter and collector electrodes in response to the bias applied thereto, direct-current supply means connected between said further electrodes and a point of reference potential in said receiver, first signal input means connected for applying an intermediate frequency signal to said base electrode, first signal output means connected for deriving an amplified intermediate frequency signal from said first further electrode, signal detection means connected with said signal output means for deriving an audio frequency signal from said intermediate frequency signal, signal coupling means connecting said signal detection means with said base electrode for applying said audio frequency signal thereto, means for generating local oscillations of a higher frequency than said intermediate-frequency, means for applying said local oscillations to said further electrodes as a relatively high-frequency power supply source to alternately provide signal translation and amplification of said intermediate-frequency signal between said base electrode and said first further electrodes through said transistor operating as a common emitter amplifier and of said audio-frequency signal between said base electrode and said second further electrode through said transistor operating as a common emitter amplifier, and second signal output circuit means connected with said second further electrode for deriving therefrom an amplified audio-frequency signal.

9. A dual-channel signal amplifier circuit for amplifying a first and a second signal of different frequencies in time-shared relation comprising, in combination, a substantially symmetrical transistor having at least a first, a second, and a third electrode, signal input means connected for applying said first and second signals to said first electrode, relatively high-frequency alternating-current supply means coupled with said transistor to bias said second and third electrodes and provide relatively high-gain signal amplification between said first and second electrodes on one half cycle and relatively high-gain signal amplification between said first and third electrodes on an alternate half-cycle, first signal output means connected with said second electrode for deriving therefrom said first signal after amplification by said transistor, and second signal output means connected with said third electrode for deriving therefrom said second signal after amplification by said transistor.

10. An amplifier circuit comprising, in combination, a semi-conductor device including a base electrode and two further electrodes, means providing a first and a second signal input circuit connected in series between said base electrode and a common junction point in said circuit, means providing an alternating current supply source including a pair of supply terminals, a first signal output circuit connected between one of said further electrodes and one of said supply terminals, a second signal output circuit connected between the other of said further electrodes and the other of said supply terminals, and direct-current bias supply means connected between said junction point and a point electrically symmetrical with respect to said pair of supply terminals.

11. An amplifier circuit as defined in claim 10, wherein different input signals of lower frequency than the frequency of said alternating current supply source are applied to said input circuits.

12. A time-sharing amplifier circuit comprising, in combination, a substantially symmetrical junction transistor including a base connection and a pair of junction connections, high-frequency voltage supply means including three terminals, means including a direct-current bias supply source and at least one signal input circuit connecting one of said terminals with said base connection, means providing a first signal output circuit connected between one of said junction connections and a second of said terminals, and means providing a second signal output circuit connected between the other of said junction connections and a third of said terminals.

13. An amplifier circuit as defined in claim 12 wherein input signals applied to said input circuit are alternately derived in amplified form from said first output circuit and said second output circuit.

References Cited in the file of this patent

UNITED STATES PATENTS 2,691,073 Lowman ---------------- Oct. 5, 1954

OTHER REFERENCES

Sziklai: "Transistor Circuits and Applications," Electronic Engineering, September 1953, pages 358–364.